United States Patent [19]

Yamamoto et al.

[11] Patent Number: 5,456,003
[45] Date of Patent: Oct. 10, 1995

[54] METHOD FOR PACKAGING A SEMICONDUCTOR DEVICE HAVING PROJECTED ELECTRODES

[75] Inventors: Akihiro Yamamoto, Yawata; Hiroaki Fujimoto, Hirakata, both of Japan

[73] Assignee: Matsushita Electric Industrial Co., Ltd., Osaka, Japan

[21] Appl. No.: 78,966

[22] Filed: Jun. 17, 1993

[30] Foreign Application Priority Data

Jun. 18, 1992 [JP] Japan ................. 4-159166

[51] Int. Cl.⁶ .................. H05K 3/30; H05K 3/34
[52] U.S. Cl. .................. 29/840; 29/832; 29/833; 228/180.21
[58] Field of Search ............. 29/832, 833, 840; 228/180.21

[56] References Cited

U.S. PATENT DOCUMENTS

| | | |
|---|---|---|
| 3,621,564 | 11/1971 | Tanaka et al. |
| 3,859,723 | 1/1975 | Hamer et al. |
| 4,494,688 | 1/1985 | Hatada et al. |
| 4,693,770 | 9/1987 | Hatada |

FOREIGN PATENT DOCUMENTS

| | | |
|---|---|---|
| 58-133936 | 9/1983 | Japan. |
| 60-86853 | 3/1985 | Japan. |
| 60-91656 | 5/1985 | Japan. |
| 60-86840 | 5/1985 | Japan. |
| 2-174233 | 7/1990 | Japan. |
| 3-104232 | 5/1991 | Japan. |

*Primary Examiner*—P. W. Echols
*Attorney, Agent, or Firm*—Ratner & Prestia

[57] ABSTRACT

A method for packaging a semiconductor device having projected electrodes is provided. The method includes the steps of: (a) placing the semiconductor device on a substrate having a plurality of groups of metallic projections formed thereon; (b) bonding electrodes of the semiconductor device with one of the groups of metallic projections at least by pressure so that the bonding strength of the metallic projections with the electrodes is greater than that of the metallic projections with the substrate; (c) repeating steps (a) and (b) until a prescribed number of semiconductor devices are bonded to the substrate through the groups of metallic projections, and transporting the substrate having the plurality of semiconductor devices; (d) transferring each of the groups of metallic projections to the semiconductor device bonded therewith by removing the semiconductor device from the substrate with the group of metallic projections attached to the electrodes of the semiconductor device; (e) placing the semiconductor device with the group of metallic projections attached thereto on a wiring board; and (f) bonding the semiconductor device with the group of metallic projections attached thereto with the wiring board.

8 Claims, 13 Drawing Sheets

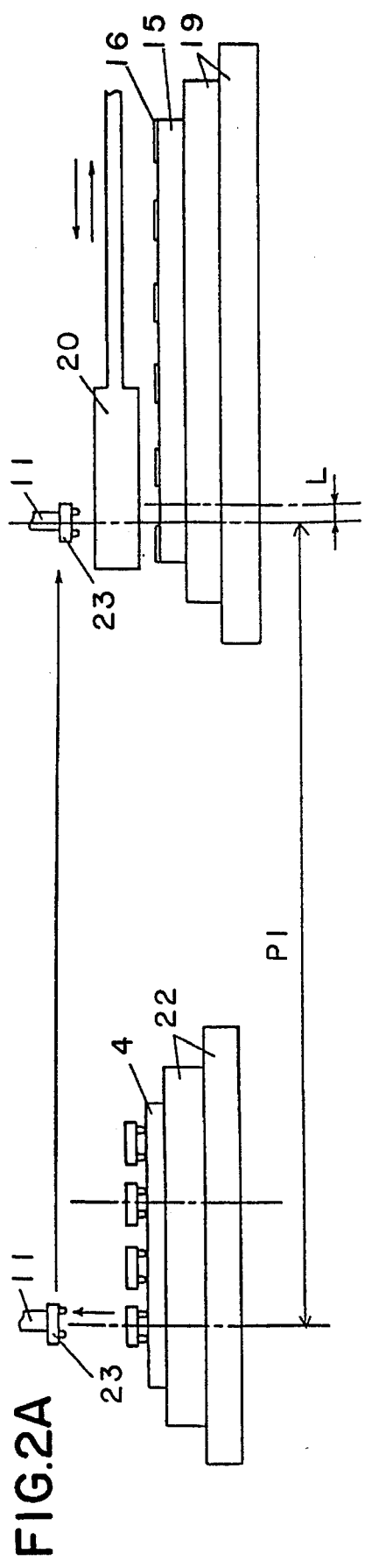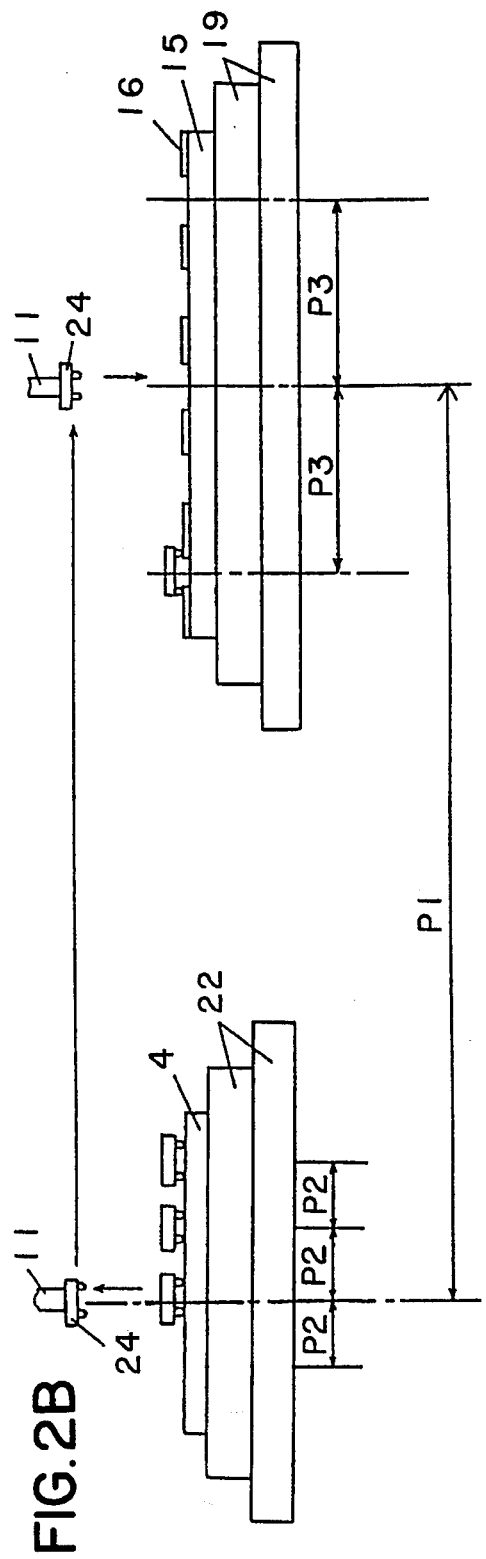

(ALL LSI CHIPS)

| STEP | (1) | (2) | (3) | (4) | (5) | (6) | (7) | (8) | (9) | TOTAL |
|---|---|---|---|---|---|---|---|---|---|---|
| TIME REQUIRED FOR STEPS ACCORDING TO THE METHOD OF THIS INVENTION (SEC.) | 2X150 | 1X150 | | | 10X1 | FIRST 1X1 | FIRST 5X1 | FIRST 1X1 | FIRST 10X1 | 2265 |
| | | | | | | THE REST 1X149 | THE REST | THE REST 1X149 | THE REST 10X149 | |
| TIME REQUIRED FOR STEPS ACCORDING TO A CONVENTIONAL METHOD (SEC.) | 2X150 | 1X150 | 1X150 | 3X150 | 10X1 | 1X150 | 5X150 | 1X150 | 10X150 | 3610 |

METHOD FOR PACKAGING A SEMICONDUCTOR DEVICE HAVING PROJECTED ELECTRODES

BACKGROUND OF THE INVENTION

1. Field of the Invention

The present invention relates to a method for packaging a semiconductor device having projected electrodes, in which metallic projections are formed on the electrodes.

2. Description of the Related Art

In recent years, a tape-automated bonding (TAB) method and a flip chip method have been practically used for packaging a semiconductor device (semiconductor chip) with a greater number of pins at narrower pitches. These methods require forming bumps (metallic projections) on electrodes of the semiconductor chip for bonding the semiconductor chip to a wiring board. Forming bumps, therefore, has become one of the critical technologies in the field of LSI packaging. Generally, bumps are formed by plating at a stage of the wafer process. This method, however, requires additional apparatuses for evaporation, etching, and the like at subsequent steps, causing high cost. There is another known method which includes forming bumps on a separate substrate (bump substrate) and transferring the bumps onto electrodes of a semiconductor chip from the bump substrate.

U.S. Pat. No. 3,621,564 discloses a method for forming bumps made of solder on a bump substrate and transferring them onto electrodes of a semiconductor chip. This method, however, has a problem as follows: when the semiconductor chip having such bumps made of solder is bonded to a wiring board by mutual diffusion, stress tends to be produced in the bumps as temperature rises due to the difference of expansion coefficients between the semiconductor chip and the wiring board. This causes a decrease in reliability of any resultant product. To solve this problem and to keep high reliability, there has been developed a method for bonding the semiconductor chip to the wiring board by contact, not by diffusion. According to this method, material for bumps should be chemically stable and resistive to the formation of an oxide film on the surface. At present, Au is mainly used as such material.

A conventional method for forming bumps on a semiconductor chip by transfer and packaging such a semiconductor chip with the bumps will be described.

FIGS. 7A to 7D schematically show steps for a conventional method for packaging a semiconductor device having projected electrodes on a board. In this method, a chip tray is provided for transporting LSI chips with bumps formed thereon.

FIG. 7A shows a first placement step, where electrodes 7 of an LSI chip 9 and bumps 5 made of Au on a bump substrate 4 are aligned with each other so as to place the LSI chip 9 in position on the bump substrate 4. The bump substrate 4 includes a conductive film 2 made of ITO or the like formed on one side of an insulating base i made of glass or the like. The bumps S are formed on the conductive film 2 of the bump substrate 4 by electroplating using a photoresist as a mask. The LSI chip 9 is lowered with the support of a vacuum collet 6 and placed on the bump substrate 4 so that the electrodes 7 of the LSI chip 9 and the bumps 5 on the bump substrate 4 are matched with each other.

FIG. 7B shows a first bonding step, where the LSI chip 9 is pressed and heated by means of a pressure tool 8, so that the electrodes 7 of the LSI chip 9 and the bumps 5 on the bump substrate 4 are bonded with each other by forming an alloy thereof for transferring the bumps 5 to the electrodes 7. FIG. 8 shows a sectional view of the bump substrate 4 and the LSI chip 9 at this bonding step. At this time, the bonding strength of the bumps 5 with the electrodes 7 is made greater than that of the bumps 5 with the bump substrate 4. The word "bonding" as used herein has a comparatively broader meaning, including the case where two kinds of metal are joined together without being alloyed.

FIG. 7C shows a transfer step and a holding step. In the transfer step, the LSI chip 9 is lifted up by sucking it with the vacuum collet 6 from the bump substrate 4. By this sucking, %he bumps 5 are removed from the bump substrate 4 and transferred to the electrodes 7 of the LSI chip 9. Then, in the holding step, the LSI chip 9 with the electrodes 7 carrying the bumps 5 is moved to a chip tray 12 so as to be held in a pocket 13 of the chip tray 12.

The above-described steps, i.e., the first placement step (FIG. 7A), the first bonding step (FIG. 7B), and the transfer step and the holding steps (FIG. 7C) are repeated for each LSI chip 9 until a plurality of LSI chips 9 with the bumps 5 transferred thereto are held on the chip tray 12. The chip tray 12 with the plurality of LSI chips 9 held thereon is then transported to a subsequent step.

FIG. 7D shows a sucking step, a second placement step, and a second bonding step. The chip tray 12 holding the LSI chips 9 thereon is transported and placed on an X-Y table 14. In the sucking step, each of the LSI chips 9 with the bumps 5 is lifted up from the pocket 13 of the chip tray 12 by sucking with a vacuum collet 11. In the second placement step, the LSI chip 9 is placed on lead wirings 16 patterned on a wiring board 15 so that the bumps 5 on the LSI chip 9 can be connected to the lead wirings 16 on the wiring board 15. Then, in the second bonding step, the LSI chip 9 is bonded with the wiring board 15.

FIGS. 9A to 9C show steps for fabricating the bump substrate 4 with the bumps 5.

Referring to FIG. 9A, the conductive film 2 is formed on the insulating base 1. An insulating film 3 is then formed on the conductive film 2, and openings 17 are formed at positions corresponding to the positions of electrodes of a semiconductor chip to which bumps are to be transferred. The insulating base 1 is made of glass or quartz, the conductive film 2 of Ti/Pt or ITO, and a resist is used as the insulating film 3. Typically, the conductive film 2 and the insulating film 3 respectively have a thickness of approximately 1 μm, the openings 17 have a diameter of approximately 10–30 μm, and the distance between the adjacent openings 17 is approximately 20 μm.

Then, referring to FIG. 9B, the bumps 5 are formed at the openings 17 by electroplating using the conductive film 2 as one of an electrode pair. At this time, the bumps 5 are formed so as to be provided with inner stress by controlling the current density and temperature at the electroplating. This is done so as to reduce the bonding strength of the bumps 5 with the bump substrate 4 to be smaller than the bonding strength of the bumps 5 with the electrodes 7 of the LSI chip 9, thereby to effect the transfer of the bumps on the bump substrate 4 to the electrodes 7 of the LSI chip 9 at the aforementioned first bonding step (refer to FIG. 7B).

The insulating film 3 is then removed as shown in FIG. 9C, thus obtaining the bump substrate 4 having the bumps 5 thereon.

FIGS. 10A and 10B show sectional views of the LSI chip 9 with the bumps 5 transferred thereto, and the wiring board 15 at the second bonding step. FIG. 10A shows a method for bonding the LSI chip 9 with the wiring board 15 by applying a photo-cure resin 18 therebetween. In this method, the bumps 5 of the LSI chip 9 and the lead wirings 16 are pressed to each other by the contraction produced when the photo-cure resin 18 is cured. In this case, an alloy layer is not formed between the bumps 5 and the lead wirings 16.

FIG. 10B shows another method for bonding the LSI chip 9 with the wiring board 15. In this method, the bumps 5 and the lead wirings 16 are bonded by thermocompression. In this case, a thin alloy layer is formed between the bumps 5 and the lead wirings 16. Other methods such as the TAB method can also be used for bonding the LSI chip 9 with the wiring board 15.

In the above-described conventional methods for packaging a semiconductor device having projected electrodes, it is required to align each LSI chip 9 with the wiring board 15, before the second alignment step, by correcting a displacement of the electrodes 7 of the LSI chip 9 with regard to the lead wirings 16 of the wiring board 15 through image recognition. FIG. 11 shows this displacement correcting step and the subsequent second placement step.

Referring to FIG. 11, the LSI chip 9 held in the pocket 13 of the chip tray 12 placed on the X-Y table 14 is lifted up by sucking with the vacuum collet 11 and transported to the wiring board 15 placed on another X-Y table 19. Because the LSI chip 9 may be shifted inside the pocket 13 of the chip tray 12 during 25 the transportation, positioning between the transported LSI chap 9 and the wiring board 15 to be bonded with the LSI chip 9 may nor be accurate, but a displacement L of the LSI chip 9 from an intended position on the wiring board 15 may be produced. In order to correct the displacement L, an alignment camera 20 is disposed between the LSI chip 9 and the wiring board 15 to monitor the positions thereof. After the displacement L has been corrected based on the results of the image recognition, the LSI chip 9 is placed on the wiring board 15.

The above displacement correction using the alignment camera 20 is performed for each LSI chip 9 when it is transported to the wiring board 15, as shown in FIG. 11, because each LSI chip 9 can be individually shifted inside the pocket 13 of the chip tray 12 during the transportation of the chip tray 12. This displacement correcting step requires two to ten seconds per LSI chip, indicating that in total a considerable time is required for this step.

Other problems are that dust may attach to 15 the bumps 5 when the LSI chip 9 is moved to the chip tray 12 and that, because the LSI chip 9 held on the chip tray 12 may be shifted inside the pocket 13 of the chip tray 12 due to vibration or the like during the transportation of the chip tray 12, stress may be produced in particular bumps 5, causing deformation of the bumps 5.

FIGS. 12A and 12B show the LSI chip 9 bonded to the wiring board 15, in which one of the bumps 5 has dust 21 attached thereto (FIG. 12A) or is deformed (FIG. 12B). As is seen from these figures, when the LSI chip 9 having such contaminated or deformed bumps 5 is bonded to the wiring board 15, inferior connection or disconnection may be caused.

SUMMARY OF THE INVENTION

The method for packaging a semiconductor device having projected electrodes of this invention comprises the steps of: (a) placing the semiconductor device on a substrate having a plurality of groups of metallic projections formed thereon; (b) bonding electrodes of the semiconductor device with one of the groups of metallic projections at least by pressure so that the bonding strength of the metallic projections with the electrodes is greater than that of the metallic projections with the substrate; (c) repeating steps (a) and (b) until a prescribed number of semiconductor devices are bonded to the substrate through the groups of metallic projections, and transporting the substrate having the prescribed number of semiconductor devices; (d) transferring each of the groups of metallic projections to the semiconductor device bonded therewith by removing the semiconductor device from the substrate with the group of metallic projections attached to the electrodes of the semiconductor device; (e) placing the semiconductor device with the group of metallic projections attached thereto on a wiring board; and (f) bonding the semiconductor device with the group of metallic projections attached thereto with the wiring board.

Alternatively, the method for packaging a semiconductor device having projected electrodes of this invention comprises the steps of: (a) placing the semiconductor device on a substrate having a plurality of groups of metallic projections formed thereon; (b) bonding electrodes of the semiconductor device with one of the groups of metallic projections at least by pressure so that the bonding strength of the metallic projections with the electrodes is greater than that of the metallic projections with the substrate; (c) repeating steps (a) and (b) until a prescribed number of semiconductor devices are bonded to the substrate through the groups of metallic projections, and transporting the substrate having the prescribed number of semiconductor devices; (d) transferring each of the groups of metallic projections to the semiconductor device bonded therewith by removing the semiconductor device from the substrate with the group of metallic projections attached to the electrodes of the semiconductor device; (e) placing the semiconductor device with the group of metallic projections attached thereto on a wiring board; and (f) bonding the semiconductor device with the group of metallic projections attached thereto with the wiring board: wherein a particular one of the prescribed number of semiconductor devices transported on the substrate at the step (c) is subjected to displacement correction in which a displacement of the particular one of the prescribed number of semiconductor devices from an intended position on the wiring board is corrected through image recognition at step (e); and the rest of the prescribed number of semiconductor devices transported on the substrate are placed on the wiring board based on accurately controlled positions of the prescribed number of semiconductor devices relative to each other on the substrate at step (e).

According to the method of the present invention, after the bonding of all the groups of metallic projections formed on a substrate with semiconductor devices has been completed, the substrate can be used as a tray carrying the semiconductor devices to a wiring board, omitting the holding step of moving the semiconductor devices with metallic projections to a tray for transportation. Moreover, the displacement correcting step for correcting the displacement of each semiconductor device with regard to the wiring board can be omitted except for an initial alignment for the first semiconductor device. Furthermore, dust attachment to or deformation of metallic projections after the transfer thereof to the semiconductor devices can be prevented.

Thus, the invention described herein makes possible the advantages of (1) providing a method for packaging a semiconductor device having projected electrodes, in which the number of packaging steps can be reduced, and (2) providing a method for packaging a semiconductor device having projected electrodes, in which inferior connection or disconnection at the bonding of the semiconductor device with the wiring board can be prevented, realizing a high-yield production.

These and other advantages of the present invention will become apparent to those skilled in the art upon reading and understanding the following detailed description with reference to the accompanying figures.

BRIEF DESCRIPTION OF THE DRAWINGS

FIGS. 2A and 2B respectively show sectional views illustrating steps of transferring the bumps to the LSI chip and bonding the LSI chip with the wiring board according to the first embodiment of the method of the present invention.

FIG. 4 is a table of estimations of the times required to complete the steps according to the first embodiment of the method of the present invention and the conventional method.

DESCRIPTION OF THE PREFERRED EMBODIMENTS

The method for packaging a semiconductor device (semiconductor chip) having projected electrodes according to the present invention will be described by way of examples with reference to the accompanying drawings as follows:

EXAMPLE 1

Figure 1A:
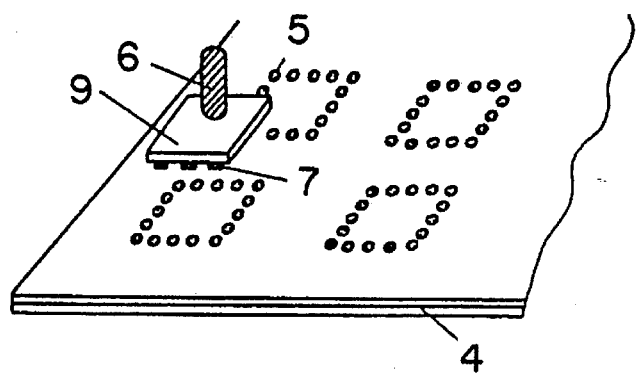
FIGS. 1A to 1C are perspective views illustrating sequential steps of placing an LSI chip on a bump substrate through bonding the LSI chip to a wiring board according to a first embodiment of the method of the present invention.
Figure 1B:
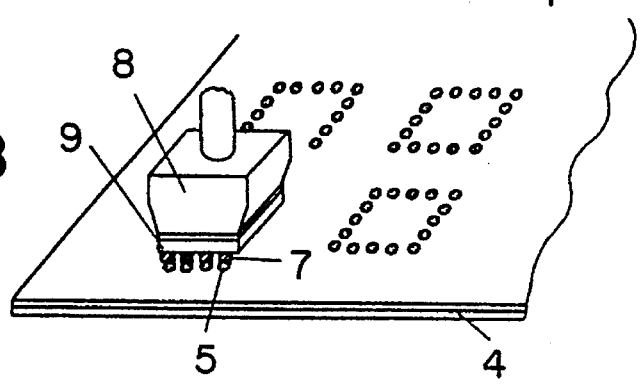
Figure 1C:
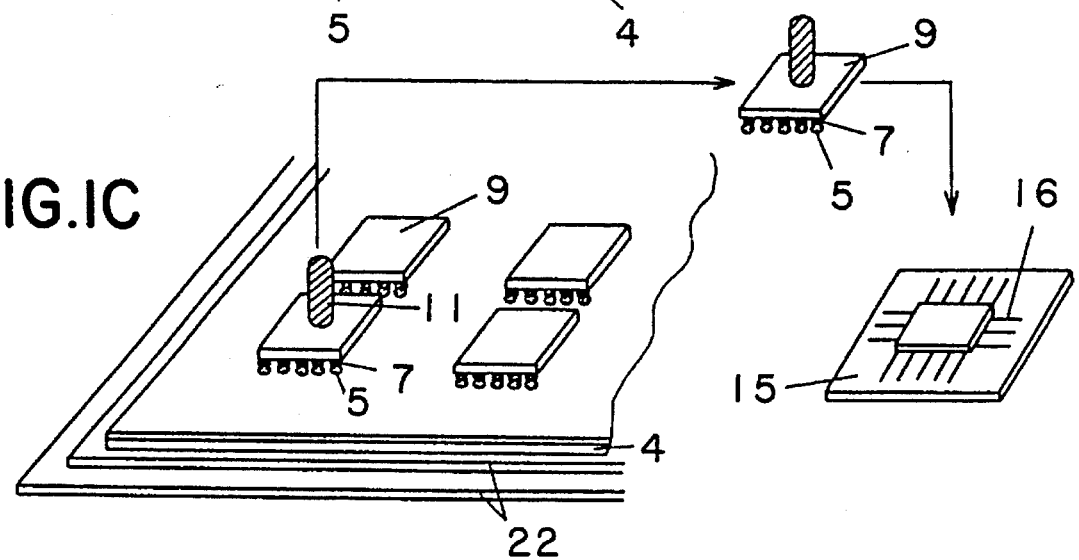

Referring to FIGS. 1A to 1C, a first embodiment of the method according to the present invention will be described. Like components are denoted as like reference numerals as those in FIGS. 7A to 7D for simplification. In this example, electrodes 7 of an LSI chip 9 are bonded with bumps 5 on a bump substrate 4 for transferring the bumps 5 to the LSI chip 9, and the bump substrate 4 holding such LSI chips 9 with the electrodes 7 and the bumps 5 thereon is transported to an X-Y table 22 for subsequent steps.

Figure 9A:
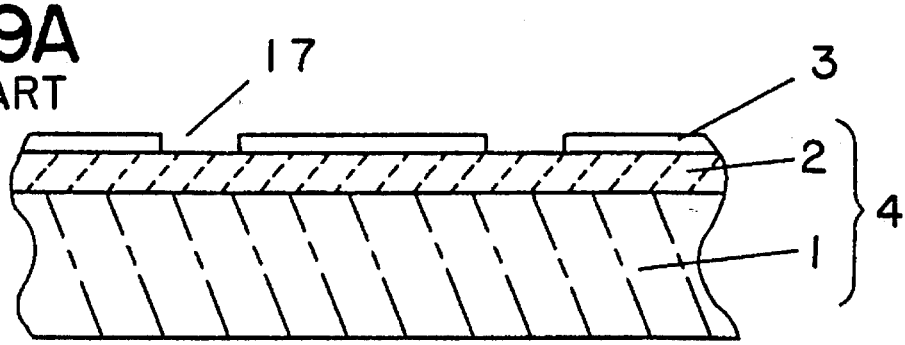
FIGS. 9A to 9C are sectional views illustrating sequential steps of forming a bump substrate.
Figure 9B:
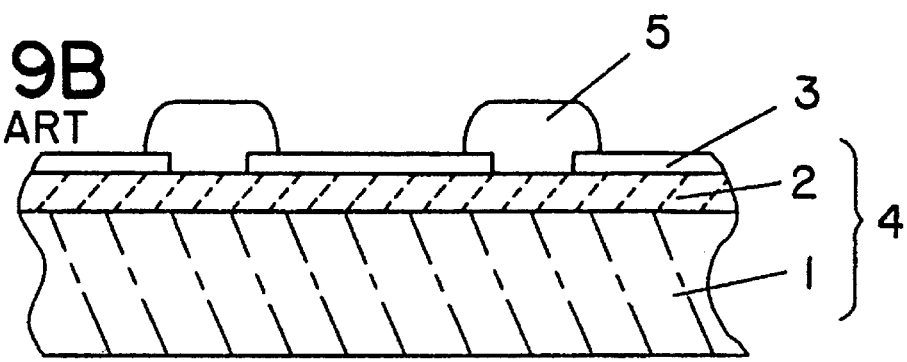
Figure 9C:
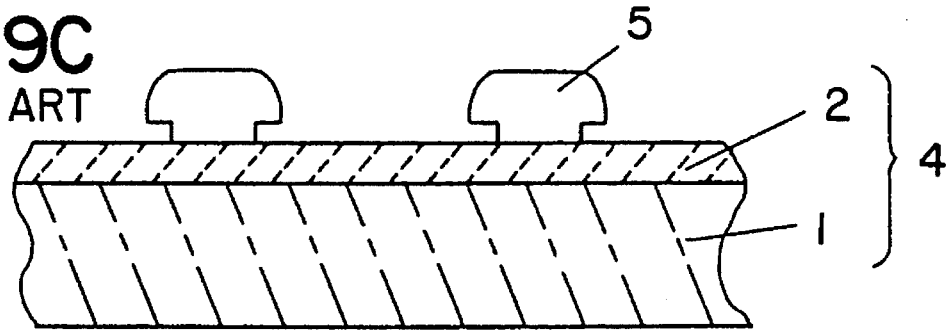
Figure 10A:
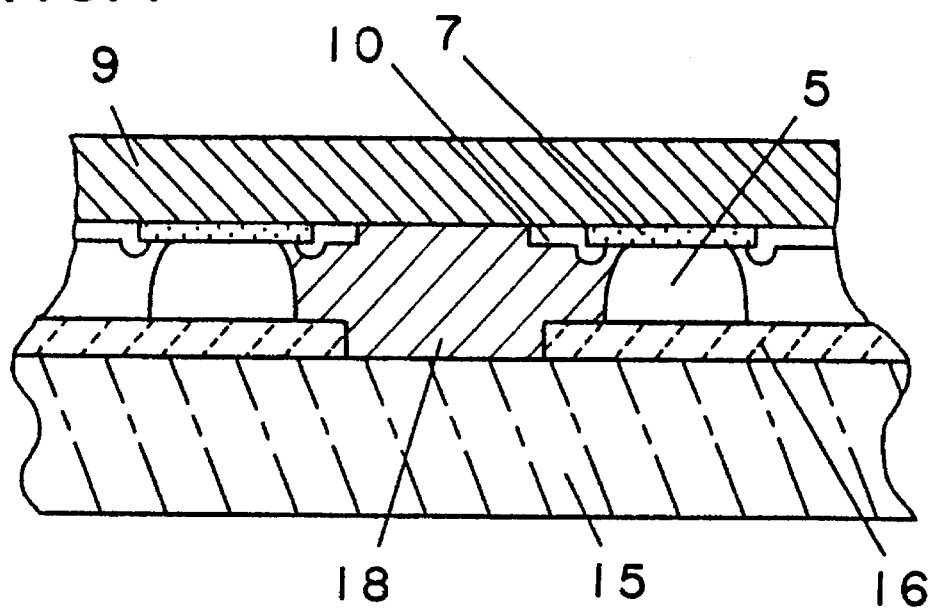
FIGS. 10A and 10B are sectional views illustrating a step of bonding the LSI chip with the wiring board.
Figure 10B:
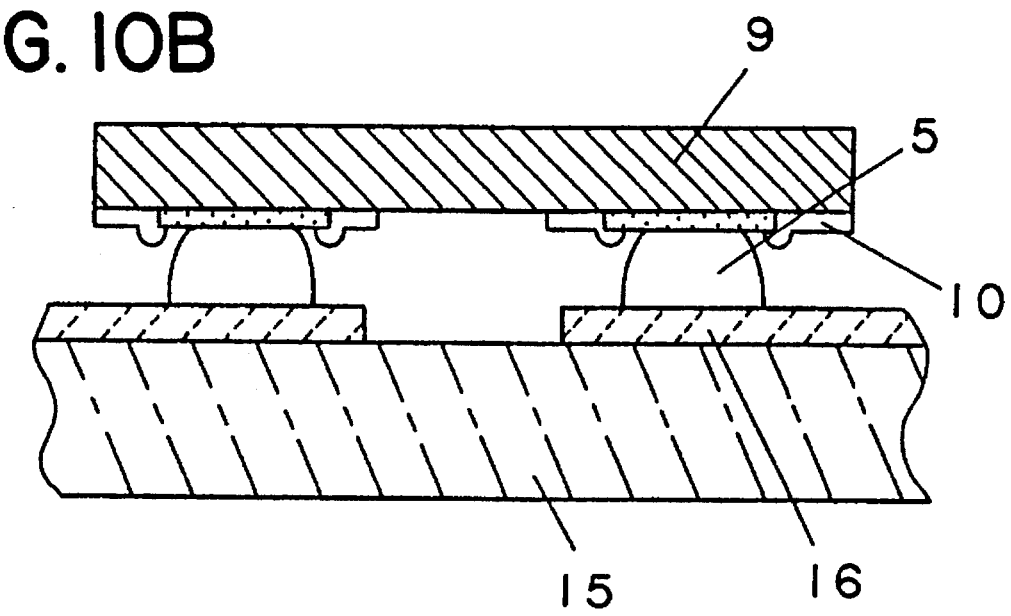

FIG. 1A shows a first placement step, where the electrodes 7 made of Al of the LSI chip 9 supported by a vacuum collet 6 and the bumps 5 made of Au on the bump substrate 4 are aligned with each other so as to place the LSI chip 9 in position on the bump substrate 4. The bump substrate 4 is fabricated by the conventional process illustrated in FIGS. 9A to 9C. The groups of bumps 5 corresponding to individual chips are formed on the bump substrate 4 at accurately controlled positions relative to each other.

FIG. 1B shows a first bonding step, where the LSI chip 9 is pressed and heated by means of a pressure tool 8 preheated to approximately 400° C., so that the electrodes 7 of the LSI chip 9 and the bumps 5 on the bump substrate 4 are bonded with each other by forming an Al-Au alloy. The bonding strength of the bumps M with the electrodes 7 is made greater than that of the bumps 5 with the bump substrate 4. The pressure by the pressure tool 8 is then released, and the LSI chip 9 with the bumps 5 bonded with the electrodes 7 is left on the bump substrate 4. The LSI chip 9 can be left on the bump substrate 4 because the bumps 5 are made of Au, not solder which is melted at the bonding step for transferring the bumps to the electrodes.

The above-described steps, i.e., the first placement step (FIG. 1A) and the first bonding step (FIG. 1B), are repeated for each LSI chip 9 until a prescribed number of LSI chips 9 are placed on the bump substrate 4. The bump substrate 4 is then transported to the X-Y table 22 for subsequent steps. Thus, according to the method of this example, the LSI chip 9 is not moved to a chip tray to be held thereon after the first bonding step as in the conventional method described earlier, but is directly transported while being held on the bump substrate 4.

FIG. 1C shows a transfer step, a second placement step, and a second bonding step. The bump substrate 4 holding a plurality of LSI chaps 9 thereon is transported to be placed on the X-Y table 22. In the transfer step, each of the LSI chips 9 is lifted up by sucking it with a vacuum collet 11 from the bump substrate 4. By this sucking, the bumps 5 are removed from the bump substrate 4 and transferred to the electrodes 7 of the LSI chip 9. The LSI chip 9 lifted up by the vacuum collet 11 is then placed on the wiring board 15 and bonded therewith.

FIGS. 2A and 2B illustrate the transfer step, the second placement step, and the second bonding step shown in FIG. 1C in more detail. FIG. 2A shows the steps when a first LSI chip 23 is positioned on the wiring board 15, and FIG. 2B shows these steps when each of the rest of LSI chips 24 is placed on the wiring board 15.

At these steps, the vacuum collet 11 lifts the first LSI chip 23 as shown in the left part of FIG. 2A, moves horizontally to the right by a prescribed distance P1, and lowers the first LSI chip 23 as shown in the right part of FIG. 2A, before moving back horizontally to the left by the distance P1. This series of simple operations is repeated for each of the rest of the LSI chips 24 as shown in FIG. 2B. The position of the X-Y table 22 is first corrected on the X-Y plane so that the vacuum collet 11 can lift the first LSI chip 23. This correction does not require to be strictly precise, and thus it can be manually carried out by the operator. When the vacuum collet 11 lifts the rest of the LSI chips 24, the X-Y table 22 is automatically moved on the X-Y plane by a distance The LSI chips 24 are regularly arranged at a prescribed distance, i.e., the distance P2. Therefore, when the rest of the LSI chips 24 are lifted by the vacuum collet 11, it is unnecessary to finely adjust the position of the X-Y table 22 on the X-Y plane through image recognition so as to align the position of the intended LSI chip 24 with regard to the position of the vertical movement of the vacuum collet 11.

When the first LSI chip 23 is placed on the lead wirings 16 by the vacuum collet 11, the X-Y table 19 is moved on the X-Y plane. At this time, the X-Y table 19 is finely adjusted through image recognition so that high precision alignment is achieved. Though the amount of the movement of the vacuum collet 11 is shown as a distance L in FIG. 2A, it varies for each correction.

Figure 11:
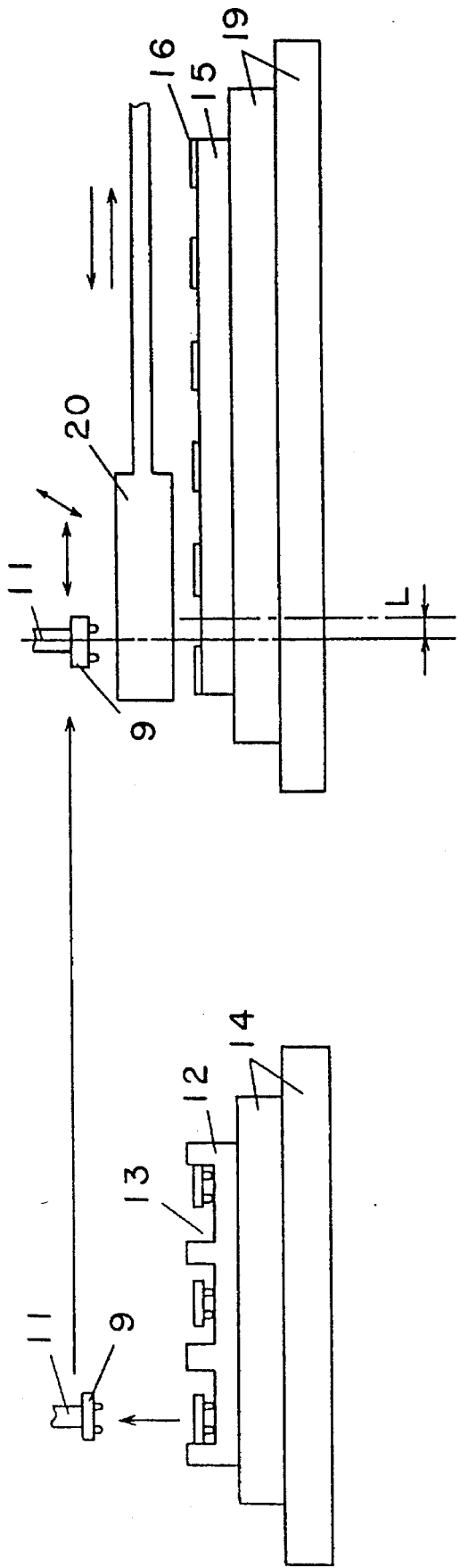
FIG. 11 shows sectional views illustrating steps of transferring bumps to the LSI chip and bonding the LSI chip with the wiring board according to the conventional method.

Referring to FIG. 2A, a displacement of the first LSI chip 23 from an intended position on the wiring board 15 is corrected automatically by means of image recognition through an alignment camera 20 disposed between the wiring board 15 and the first LSI chip 23, as in the conventional method shown in FIG. 11. Thereafter, the first LSI chip 23 is placed in position on the wiring board 15. The correction can be manually carried out by the operator who watches the enlarged image produced through the alignment camera 20 during the correction.

Then, referring to FIG. 2B, the transfer step and the second placement step for the rest of the LSI chips 24 on the bump substrate 4 will be described. Since the plurality of LSI chips 9 are transported while being held on the bump substrate 4, they are not shifted during the transportation. Since the groups of bumps 5 have been formed on the bump substrate 4 at accurately controlled positions relative to each other, the LSI chips 9 bonded to the groups of bumps 5 are also arranged on the bump substrate 4 at accurately controlled positions relative to each other. Accordingly, after the first LSI chip 23 is aligned with the wiring board 15 and bonded therewith at an accurate position, the LSI chip 24 can be correctly placed on the wiring board 15 only by the transfer step and the placement step without the necessity of the displacement correcting step using the alignment camera 20. That is, the LSI chip 24 can be placed in position on the wiring board 15 by a simplified operation including the movement of the vacuum collet 1 by the distance P1, the movement of the X-Y table 22 by the prescribed distance P2, and the movement of the X-Y table 19 by the prescribed distance P3. The displacement correcting step can also be omitted for the rest of the plurality of LSI chips 9 transported on the same bump substrate 4.

Figure 3A:
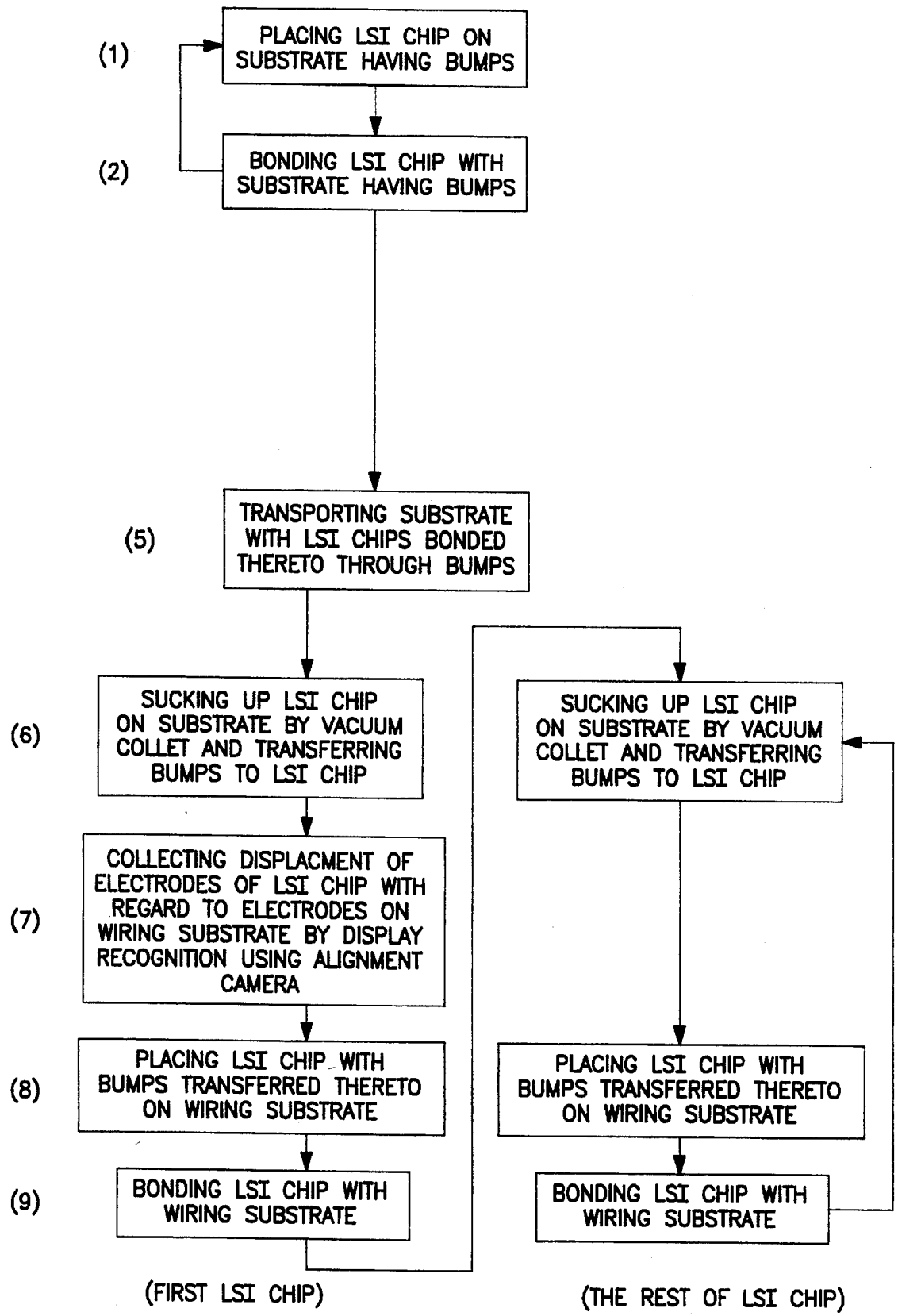
FIGS. 3A and 3B are flow charts of the first embodiment of the method according to the present invention and a conventional method, respectively.

FIG. 3A is a flow chart showing the above-described steps of the method of this example according to the present invention. For comparison, the flow chart showing the steps of the conventional method described earlier is also shown in FIG. 3B. As is seen from these figures, in the conventional method, a total of nine steps is required from placing the LSI chip on the bump substrate formed thereon until bonding the LSI chip with the wiring board. In the method of this example, however, only six steps are required for the LSI chips except the one first lifted up from the bump substrate, saving three steps from the conventional method.

Specifically, according to the method of this example, the transfer step (3) and the holding step (4) in the conventional method can be omitted, saving approximately two seconds per LSI chip. Further, for the plurality of LSI chips placed on the same bump substrate except the one first lifted up therefrom, the displacement correcting step (7) can be omitted, saving approximately 2–10 seconds per LSI chip. Considering the mass-production of such LSI chips having bumps formed in the transfer method, a significant amount of time can be saved.

Figure 3B:
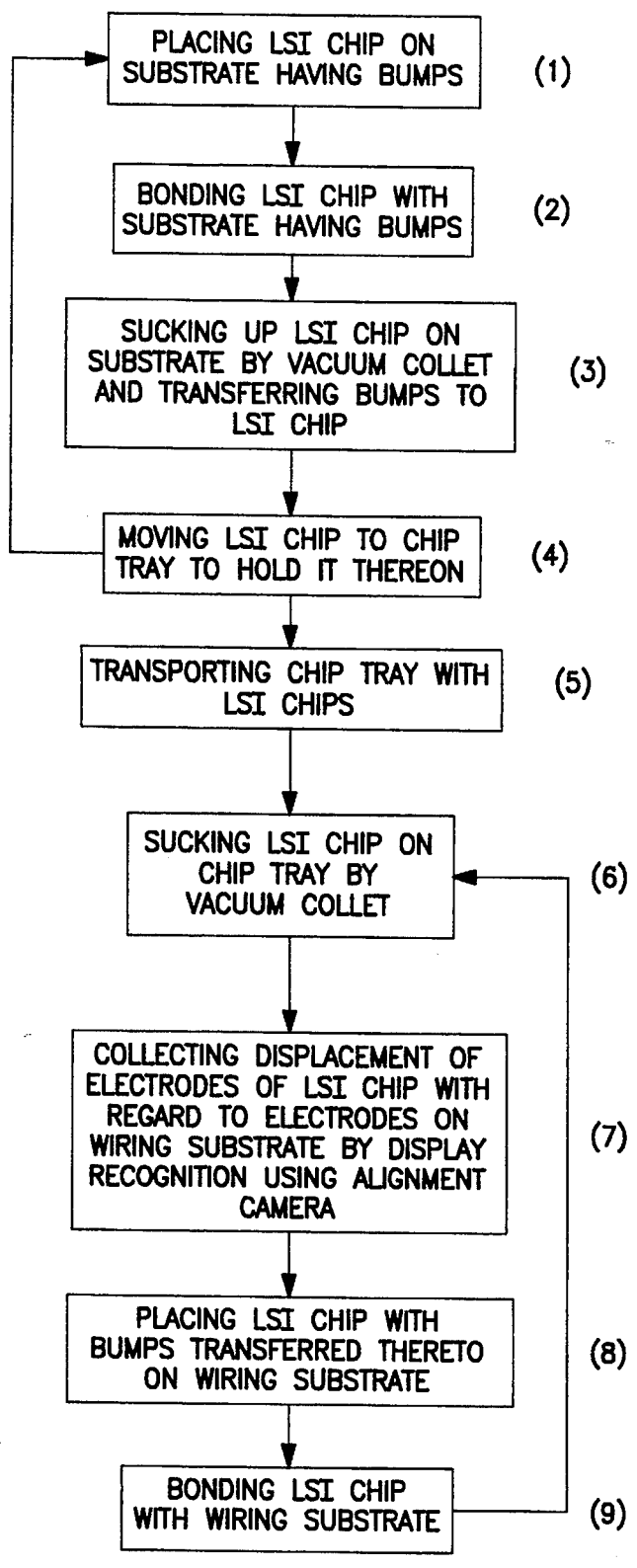

FIG. 4 shows estimations of the times required to accomplish the above steps shown in FIGS. 3A and 3B, taking as an example the case where a total of 150 LSI chips can be placed on one bump substrate. The step numbers in FIG. 4 correspond to those indicated in FIGS. 3A and 3B. From the results shown in FIG. 4, according to the method of this example, the time required for 150 LSI chips to be bonded on the wiring board can be reduced to 2265 seconds from 3610 seconds conventionally required.

Figure 12A:
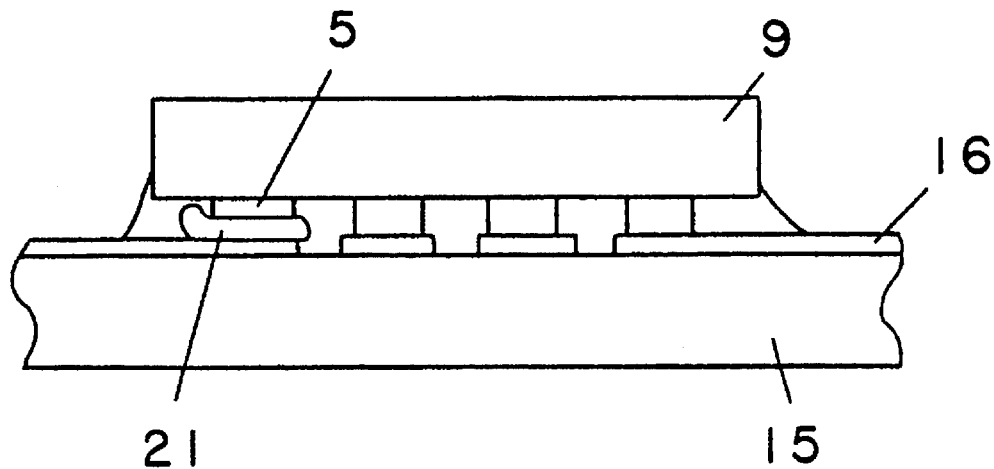
FIGS. 12A and 12B illustrate defects occurring at the bonding step according to the conventional method.
Figure 12B:
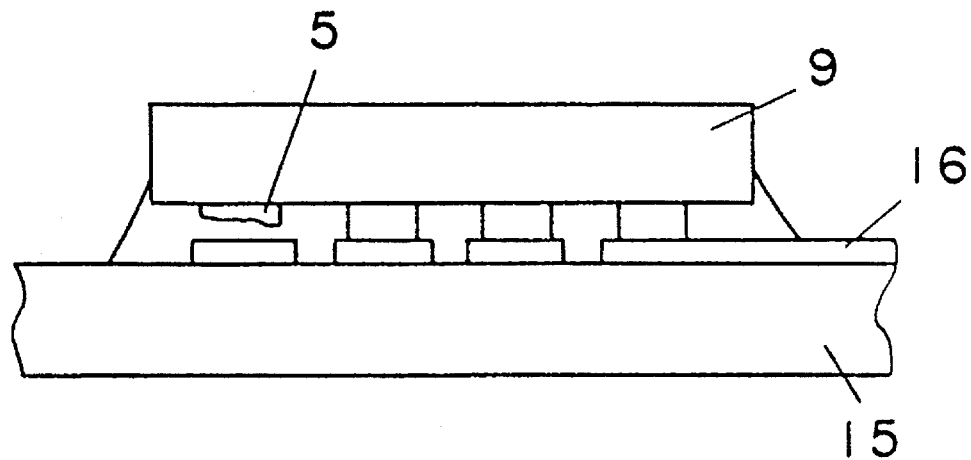

Moreover, according to the method of this example, the LSI chip 9 is not held on a chip tray after the bonding of the bumps 5 with the electrodes 7 of the LSI chip 9. Accordingly, there occurs neither dust attachment to the LSI chip 9 nor deformation of the bumps 5 as shown in FIGS. 12A and 12B which are likely to occur during the moving of the LSI chip 9 to the chip tray and during the transportation of the chip tray, respectively. As a result, the problem of inferior connection or disconnection caused at the bonding of the LSI chips 9 with the wiring board 15 is minimized, and thus high yield is obtained in the packaging of the LSI chips 9.

According to the method of this example, however, the bump substrate 4 is transported to a subsequent step carrying the plurality of LSI chips 9 held thereon. During this transportation, when the LSI chips 9 are large and heavy enough, they might be shifted due to their own weight, though such shifting is far less probable compared with the situation in the conventional method. The shifted LSI chip might contact an adjacent LSI chip, increasing the number of LSI chips shifted.

EXAMPLE 2

Another embodiment of the method of the present invention will be described. Like components are denoted as like reference numerals as described in FIGS. 1A to 1C.

Figure 5A:
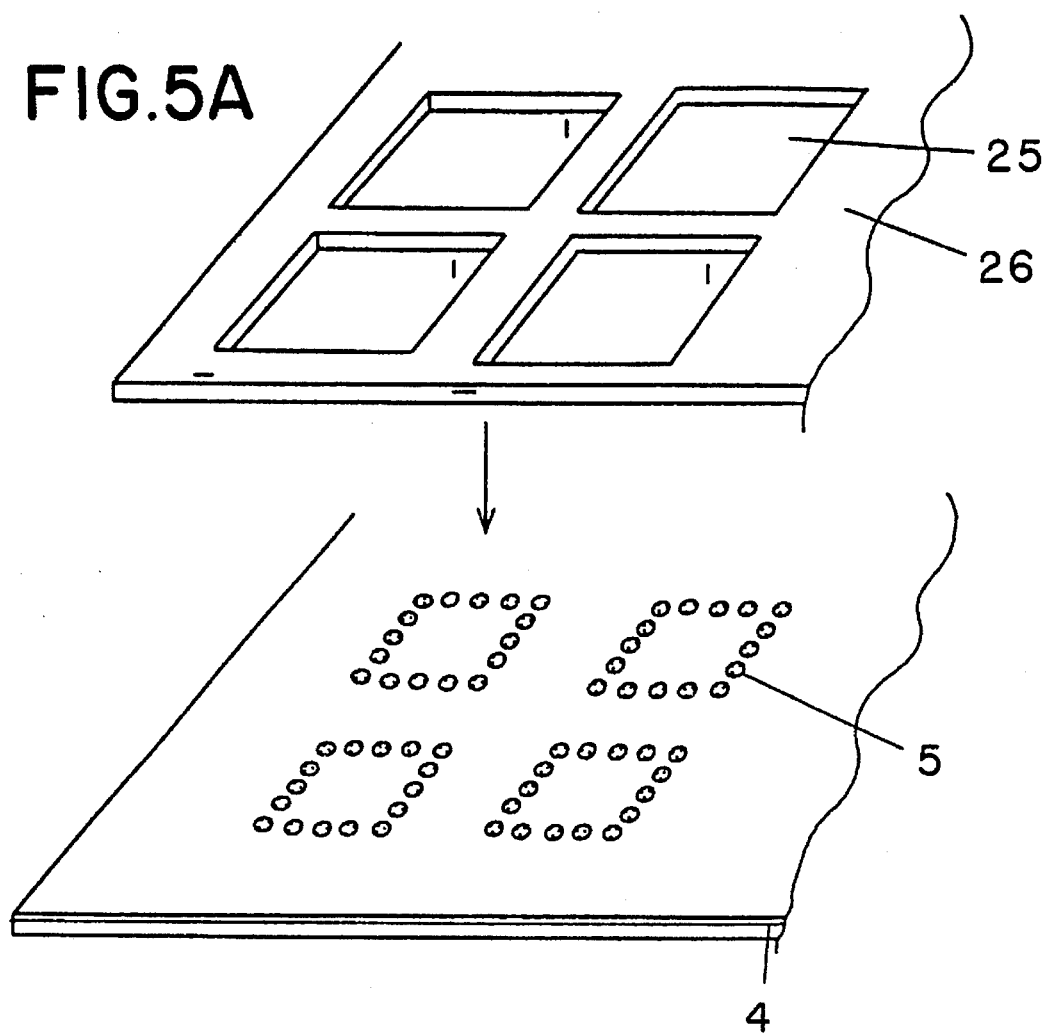
FIGS. 5A and 5B are perspective views illustrating steps of attaching a frame to a substrate having bumps according to a second embodiment of the method of the present invention.
Figure 5B:
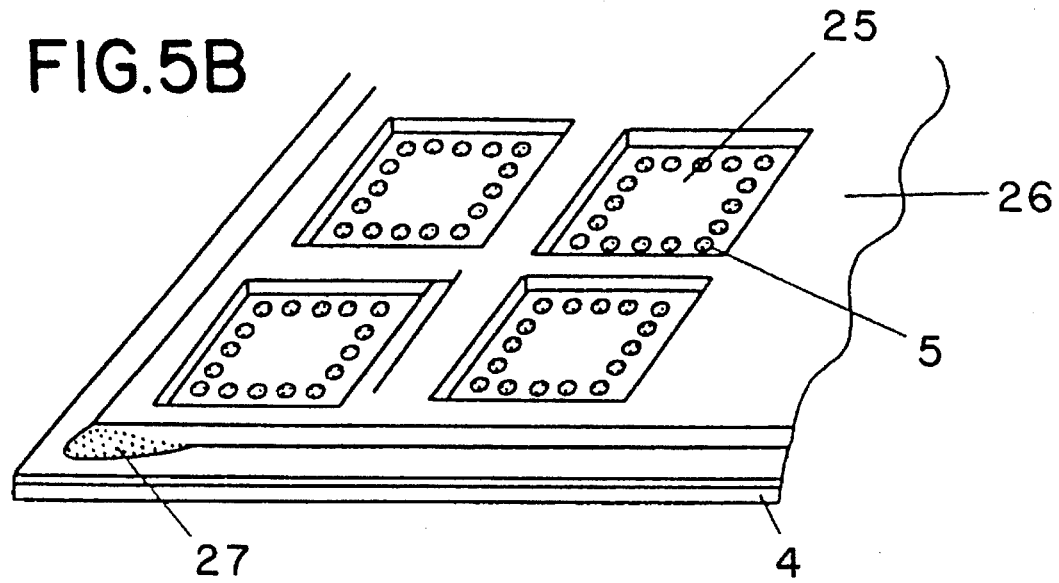

In this example, as shown in FIG. 5A, a frame 26 having openings 25 is prepared. The openings 25 correspond to areas of a bump substrate 4 on which groups of bumps 5 made of Au are formed. The frame 26 is made of a metallic or plastic sheet having a thickness of approximately 50–200 μm, and such a sheet is etched or punched to form the openings Referring to FIG. 5B, the frame 26 is attached to the bump substrate 4 so that the openings 25 match the areas where the groups of bumps 5 are formed by applying an adhesive 27 to the periphery of the frame 26.

Figure 6A:
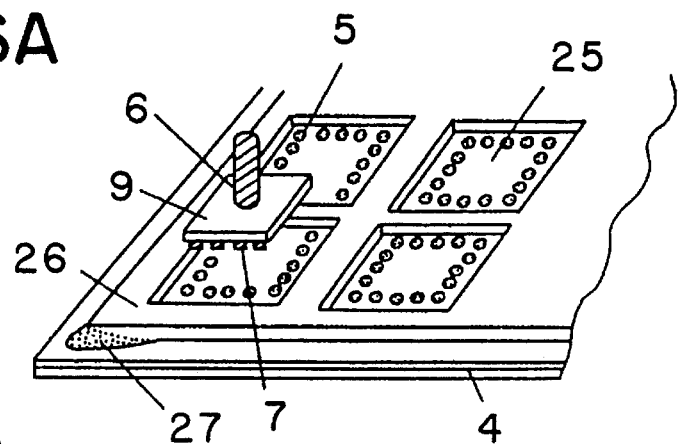
FIGS. 6A to 6C are perspective views illustrating sequential steps of placing an LSI chip on a substrate having bumps through bonding the LSI chip with a wiring board according to the second embodiment of the method of the present invention.
Figure 6B:
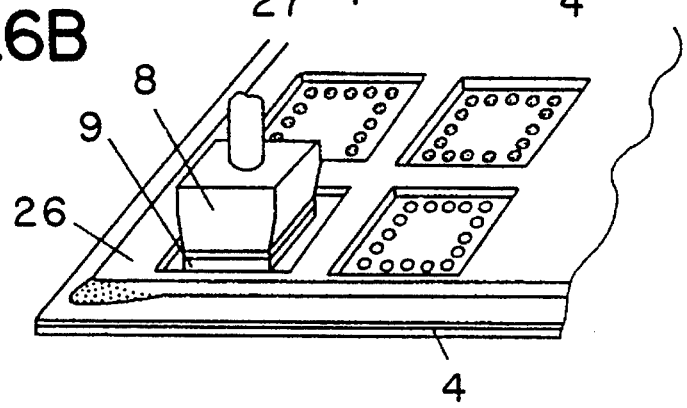
Figure 6C:
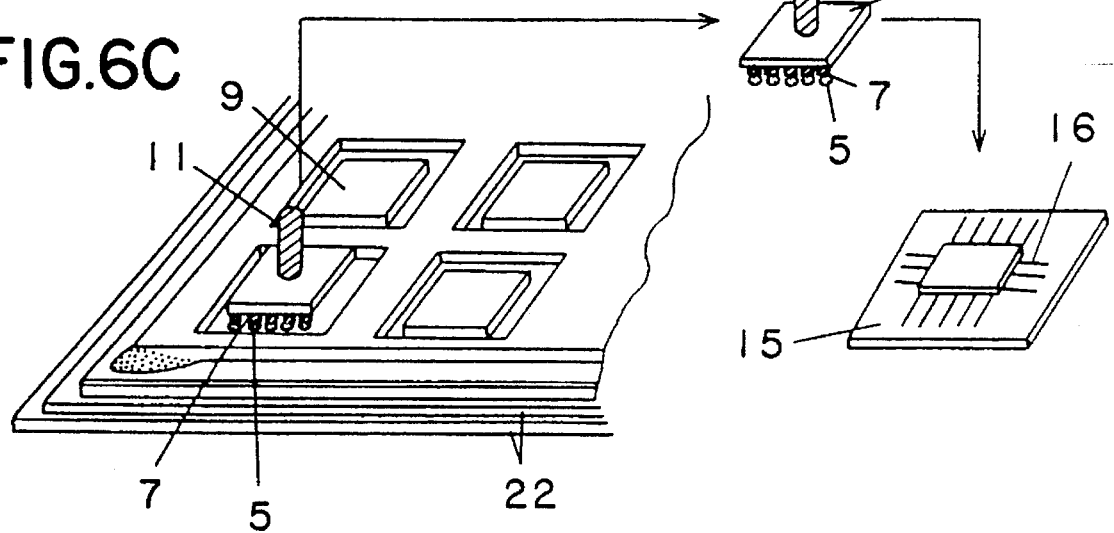
Figure 7A:
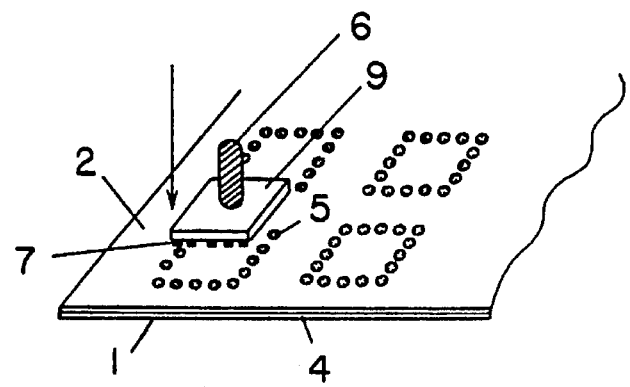
FIGS. 7A to 7D are perspective views illustrating sequential steps of placing an LSI chip on a bump substrate through bonding the LSI chip with a wiring board according to a conventional method.
Figure 7B:
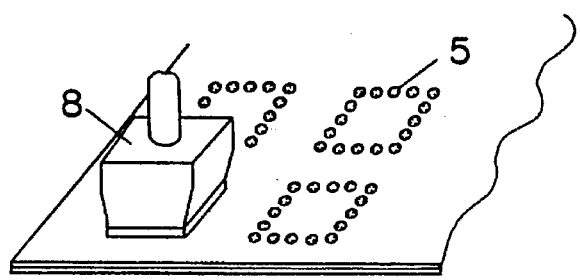
Figure 7C:
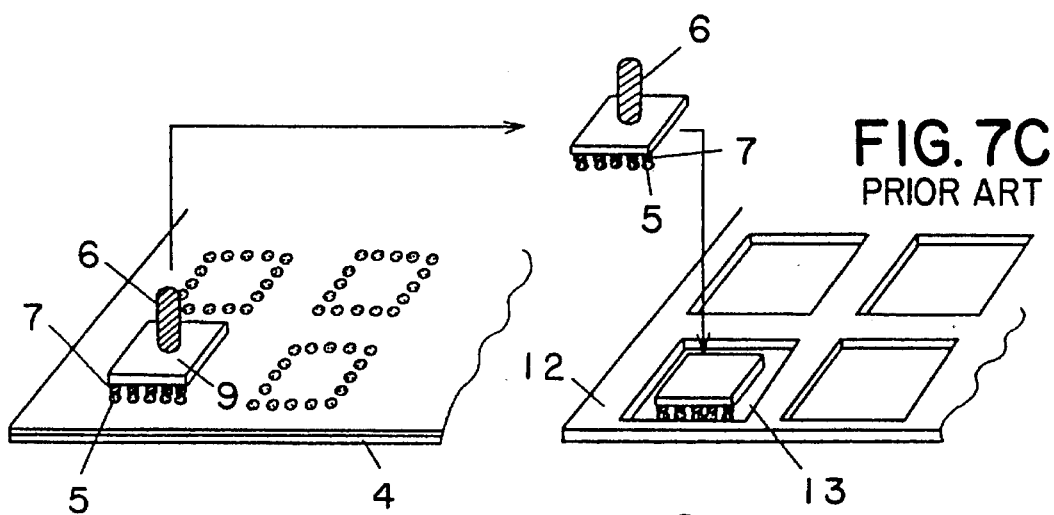
Figure 7D:
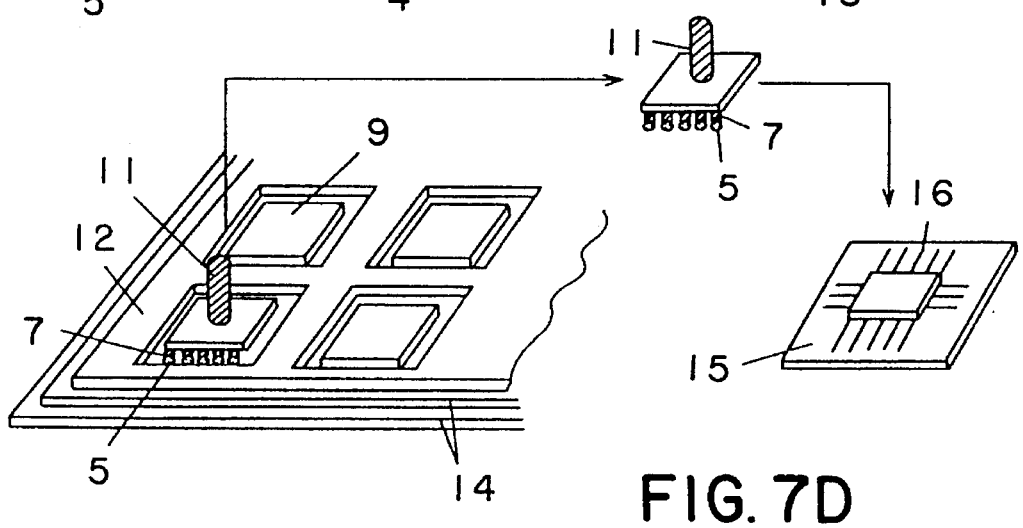
Figure 8:
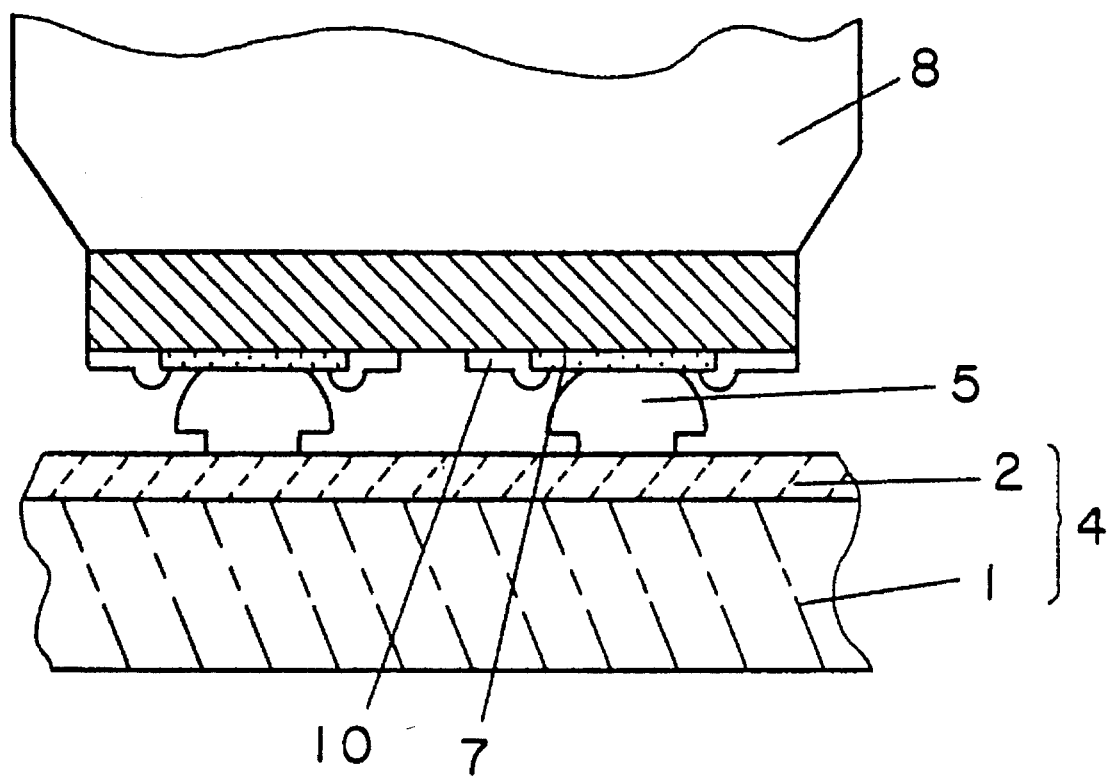
FIG. 8 is a sectional view illustrating a step of bonding bumps to an LSI chip.

The subsequent steps of bonding the bumps 5 with an LSI chip 9, transporting the bump substrate 4 carrying the LSI chip 9 to a stage for bonding, and bonding the LSI chip 9 with a wiring board 15 as shown in FIGS. 6A to 6C are the same to those in Example 1 shown in FIGS. 1A to 1C. In this example, however, if any one of the LSI chips 9 on the bump substrate 4 is shifted during the transportation of the bump substrate 4, such shifting is restrained in the range of the opening 25, thereby minimizing the influence of the shafting of one LSI chip 9 to adjacent ones.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for packaging a semiconductor device having projected electrodes, comprising the steps of:

(a) placing said semiconductor device on a substrate having a plurality of groups of metallic projections formed thereon;

(b) bonding electrodes of said semiconductor device with one of said groups of metallic projections at least by pressure so that the bonding strength of said metallic projections with said electrodes is greater than that of said metallic projections with said substrate;

(c) repeating said steps (a) and (b) until a prescribed number of semiconductor devices are bonded to said substrate through said groups of metallic projections, and transporting said substrate having said prescribed number of semiconductor devices to a position for executing a transferring step defined in step (d);

(d) transferring each of said groups of metallic projections to said semiconductor device bonded therewith by removing said semiconductor device from said substrate with said group of metallic projections attached to said electrodes of said semiconductor device;

(e) placing said semiconductor device with said group of metallic projections attached thereto on a wiring board; and (f) bonding said semiconductor device with said group of metallic projections attached thereto with said wiring board.

2. A method according to claim 1, wherein said substrate has frames surrounding said groups of metallic projections formed corresponding to said electrodes of said semiconductor device.

3. A method according to claim 1, wherein said substrate has frames surrounding said groups of metallic projections formed corresponding to said electrodes of said semiconductor device, and said groups of metallic projections are made of metal not melting at said step (b).

4. A method according to claim 1, wherein said substrate has frames surrounding said groups of metallic projections formed corresponding to said electrodes of said semiconductor device, and said groups of metallic projections are made of Au.

5. A method for packing a semiconductor device having projected electrodes, comprising the steps of:

(a) placing said semiconductor device on a substrate having a plurality of groups of metallic projections formed thereon;

(b) bonding electrodes of said semiconductor device with one of said groups of metallic projections at least by pressure so that the bonding strength of said metallic projections with said electrodes is greater than that of said metallic projections with said substrate;

(c) repeating said steps (a) and (b) until a prescribed number of semiconductor devices are bonded to said substrate through said groups of metallic projections, and transporting said substrate having said prescribed number of semiconductor devices to a position for executing a transferring step defined in step (d);

(d) transferring each of said groups of metallic projections to said semiconductor device bonded therewith by removing said semiconductor device from said substrate with said group of metallic projections attached to said electrodes of said semiconductor device;

(e) placing said semiconductor device with said group of metallic projections attached thereto on a wiring board; and (f) bonding said semiconductor device with said group of metallic projections attached thereto with said wiring board;

wherein a particular one of said prescribed number of semiconductor devices transported on said substrate at said step (c) is subjected to displacement correction in which a displacement of said particular one of said prescribed number of semiconductor devices from an intended position on said wiring board is corrected through image recognition at said step (e); and the rest of said prescribed number of semiconductor devices transported on said substrate are placed on said wiring board based on accurately controlled positions of said prescribed number of semiconductor devices relative to each other on said substrate at said step (e).

6. A method according to claim 5, wherein said substrate has frames surrounding said groups of metallic projections formed corresponding to said electrodes of said semiconductor device.

7. A method according to claim 5, wherein said substrate has frames surrounding said groups of metallic projections formed corresponding to said electrodes of said semiconductor device, and said groups of metallic projections are made of meal not melting at said step (b).

8. A method according to claim 5, wherein said substrate has frames surrounding said groups of metallic projections formed corresponding to said electrodes of said semiconductor device, and said groups of metallic projections are made of Au.

* * * * *

UNITED STATES PATENT AND TRADEMARK OFFICE
CERTIFICATE OF CORRECTION

PATENT NO. : 5,456,003
DATED : October 10, 1995
INVENTOR(S) : Yamamoto et al.

It is certified that error appears in the above-indentified patent and that said Letters Patent is hereby corrected as shown below:

Column 1, line 59, delete "base i" and insert --base 1--.

Column 1, line 60, delete "S" and insert --5--.

Column 2, line 14, delete "%he" and insert --the--.

Column 2, line 59, after "the bumps" insert --5--.

Column 3, line 29, delete "25".

Column 3, line 47, delete "15".

Column 6, line 18, delete "M" and insert --5--.

Column 6, line 65, after "distance" insert --P2.--.

UNITED STATES PATENT AND TRADEMARK OFFICE
CERTIFICATE OF CORRECTION

PATENT NO. : 5,456,003
DATED : October 10, 1995
INVENTOR(S) : Yamamoto et al.

It is certified that error appears in the above-indentified patent and that said Letters Patent is hereby corrected as shown below:

Column 7, line 44, delete "vacuum collet 1" and insert --vacuum collet 11--.

Column 8, line 42, after "openings" insert --25.--.

Column 10, line 40, delete "meal" and insert --metal--.

Signed and Sealed this

Seventh Day of May, 1996

Attest:

Attesting Officer

BRUCE LEHMAN

Commissioner of Patents and Trademarks